United States Patent [19]

Kane

[11] Patent Number: 5,029,277
[45] Date of Patent: Jul. 2, 1991

[54] OPTICALLY COMPENSATED BIPOLAR TRANSISTOR

[75] Inventor: Robert C. Kane, Woodstock, Ill.

[73] Assignee: Motorola, Inc., Schaumburg, Ill.

[21] Appl. No.: 486,567

[22] Filed: Feb. 28, 1990

[51] Int. Cl.$^5$ ............................................. H01J 40/14
[52] U.S. Cl. .............................. 250/214 C; 250/238; 307/310
[58] Field of Search .................. 250/214 C, 238, 205, 250/214 B; 307/310, 491, 311; 357/19, 28, 30 P

[56] References Cited

U.S. PATENT DOCUMENTS

| | | | |
|---|---|---|---|
| 3,421,009 | 1/1969 | Caruthers | 250/238 |
| 3,705,316 | 12/1972 | Burrous et al. | 250/205 |
| 4,694,157 | 12/1987 | Mishina | 250/214 C |
| 4,710,631 | 12/1987 | Aotsuka et al. | 250/205 |
| 4,725,723 | 2/1988 | Shimojima | 250/205 |
| 4,812,635 | 3/1989 | Kaufmann et al. | 250/205 |
| 4,841,170 | 6/1989 | Eccleston | 307/310 |

FOREIGN PATENT DOCUMENTS 3604971  8/1987  Fed. Rep. of Germany ... 250/214 C

Primary Examiner—David C. Nelms
Assistant Examiner—Michael Messinger
Attorney, Agent, or Firm—John W. Hayes

[57] ABSTRACT

A method for temperature compensation of a bipolar transistor through optically-induced carrier density enhancement. In response to the output of a temperature sensor, the optical output power of a photon source directed toward the bipolar transistor to be compensated is varied. Photons incident on the semiconductor surface effect variations in supplemental carrier concentration that maintain junction potential of the bipolar transistor at a predetermined level.

16 Claims, 5 Drawing Sheets

OPTICALLY COMPENSATED BIPOLAR TRANSISTOR

TECHNICAL FIELD

This invention relates generally to bipolar transistors, and in particular to a method for temperature compensation of a bipolar transistor junction through optically-induced carrier density enhancement.

BACKGROUND ART

The performance of bipolar transistors is strongly affected by temperature variations. These variations in temperature manifest themselves as a shift in the junction potential of the device. As temperature decreases, junction potential increases rather dramatically.

Compensation schemes of the prior art, implemented externally to the device itself, simply increase or decrease input drive level to track the varying junction potential. This compensation method places increased demand on the stage being used to drive the bipolar transistor under consideration, and adds cost and complexity to external circuitry. Also, at extremely low temperatures, it is possible that the device may never turn on due to depletion of intrinsic carriers in the base region.

Accordingly, a need arises for a method for compensating a bipolar transistor for variations in junction potential caused by changes in temperature. The method should adequately compensate for decreases in intrinsic carrier concentration, but should not add undue complexity or cost to eventual circuit designs.

SUMMARY OF THE INVENTION

The above-described need may be addressed by placing a photon source within the transistor package. Bipolar transistors intended for radio frequency (RF) amplifier applications are generally available in relatively large packages. These packages can easily accommodate a photon source and a temperature sensor. According to the invention, the temperature of the bipolar transistor is sensed, and, in response to this sensed temperature, a sufficient number of photons is directed toward the bipolar transistor to substantially maintain the junction potential at a predetermined level. Temperature sensing is accomplished through measuring junction potential of a reference diode located in close proximity to the bipolar transistor, while the photon source is a light emitting diode.

In the preferred embodiment, the photon source has a variable output power, which is adjusted in response to temperature sensor output to substantially maintain the junction potential of the bipolar transistor at a predetermined level. The temperature sensor comprises a reference diode that is optically passivated; that is, subjected to additional process steps known in the art to render it substantially impervious to photon bombardment. In this way, the reference diode remains unaffected by the photons, so that its junction potential accurately reflects temperature in the vicinity of the bipolar transistor to be compensated.

In one embodiment, in order to ensure that the photon source is properly directed toward the bipolar transistor, a reflective region is disposed upon an interior surface of the bipolar transistor package. At least a portion of the photons from the photon source are reflected onto the bipolar transistor to substantially maintain the junction potential at a predetermined level.

In an alternative embodiment, the photon source is located remotely from the bipolar transistor, with photons from the photon source being directed toward the bipolar transistor over a suitable optical medium, such as fiber optic cable. As is well-known in the art, a fiber optic cable is constructed from material that acts to contain optical energy, allowing the energy to be conducted from one point to another.

DETAILED DESCRIPTION OF THE INVENTION

Emitter-base junction characteristics for bipolar transistors may be expressed as:

$$\phi_p = \frac{k_2 T}{q} \ln\left(\frac{N_a}{n_i}\right)$$

where:
$\phi_p$ is the potential at the p side of the junction,
$k_2$ is Boltzmann's constant (in J/°K.),
T is temperature (°K.),
q is the elementary charge,
$N_a$ is the acceptor carrier concentration,
$n_i$ is the intrinsic carrier concentration,
and, $$\phi_n = \frac{k_2 T}{q} \ln\left(\frac{N_d}{n_i}\right)$$

where:
$\phi_n$ is the potential at the n side of the junction, and
$N_d$ is the donor carrier concentration.

$\phi$, the sum of the potentials on either side of the junction, represents the junction, or built-in, potential, and is expressed as:

$$\phi = \frac{k_2 T}{q} \ln\left(\frac{N_a N_d}{n_i^2}\right)$$

The intrinsic carrier concentration, $n_i$, may be expanded explicitly to show its temperature dependence:

$$n_i = C T^{3/2} e^{(-E_g/2k_1 T)}$$

where:
$E_g$ is the band-gap voltage,
$k_1$ is Boltzmann's constant (in eV/°K.), and $$C = (1 \times 10^{-6}) \frac{[(2\pi)^{3/2}(m_e m_h)^{\frac{3}{4}} M_c^{\frac{1}{2}} k_2^{3/2}]}{0.5 h^3}$$

where:
$m_e$ is the effective mass of the electron,
$m_h$ is the effective mass of the hole,
$M_c$ is the number of conduction band minima, and
$h$ is Planck's constant (in J-s).

Figure 1:
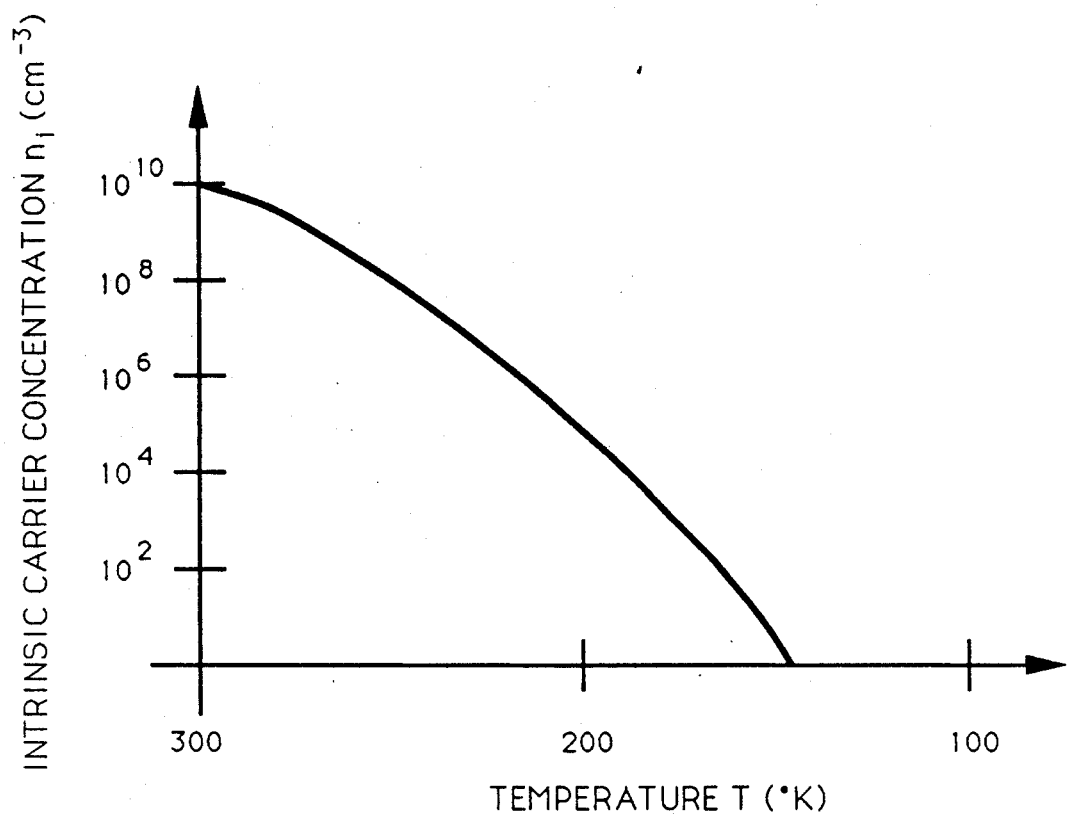
FIG. 1 is a graph of intrinsic carrier concentration versus temperature.

The expression for the constant C is derived from the representation of intrinsic carrier concentration in terms of conduction band and valence band state densities. Variation of intrinsic carrier concentration with temperature, in accordance with the above-described relationship, is illustrated in FIG. 1.

Since $n_i$, the intrinsic carrier concentration, can be written as:

$$n_i = (N_c N_v)^{\frac{1}{2}} e^{(-E_g/2k_1 T)}$$

and $N_c$ and $N_v$, the conduction band and valence band state densities, respectively, can be expressed as:

$$N_c = 2\left(\frac{2\pi m_{de} k_2 T}{h^2}\right)^{3/2} M_c$$

$$N_v = 2\left(\frac{2\pi m_{dh} k_2 T}{h^2}\right)^{3/2}$$

where $m_{de}$ is the effective transverse mass of the electron, while $m_{dh}$ is the effective transverse mass of the hole. The effective transverse mass of the hole can be written as:

$$m_{dh} = (m_{hh}^{*3/2} + m_{lh}^{*3/2})^{\frac{2}{3}}$$

where $m_{hh}^*$, the effective mass of the heavy hole, is 0.49, and $m_{lh}^*$, the effective mass of the light hole, is 0.16. The effective transverse mass of the electron, $m_{de}$, is 0.19.

The expression for $\phi$, the junction potential, may now be rewritten as:

$$\phi = \frac{k_2 T}{q} \ln\left(\frac{N_a N_d}{C T^{3/2} e^{(-E_g/2k_1 T)}}\right)$$

Expanding the constant C, as previously defined, the expression for junction potential becomes:

$$\phi =$$

$$\frac{k_2 T}{q} \ln\left(\frac{N_a N_d}{[(2 \times 10^{-6}) h^{-3} (2\pi)^{3/2} M_c^{\frac{1}{2}} (m_e m_h)^{\frac{3}{4}} k_2^{3/2} T^{3/2} e^{(-E_g/2k_1 T)}]^2}\right)$$

If a new constant $C_1$ is now defined as follows:

$$C_1 = \left(\frac{N_a N_d}{[(2 \times 10^{-6}) h^{-3} (2\pi)^{3/2} M_c^{\frac{1}{2}} (m_e m_h)^{\frac{3}{4}} k_2^{3/2}]^2}\right)$$

then, $$\phi = \frac{k_2 T}{q} \ln\left(\frac{C_1}{T^3 e^{(-E_g/k_1 T)}}\right)$$

The band-gap voltage, $E_g$, is known to exhibit a temperature dependency given by:

$$E_g = 1.205 - 0.28 \times 10^{-3} T$$

Figure 2:
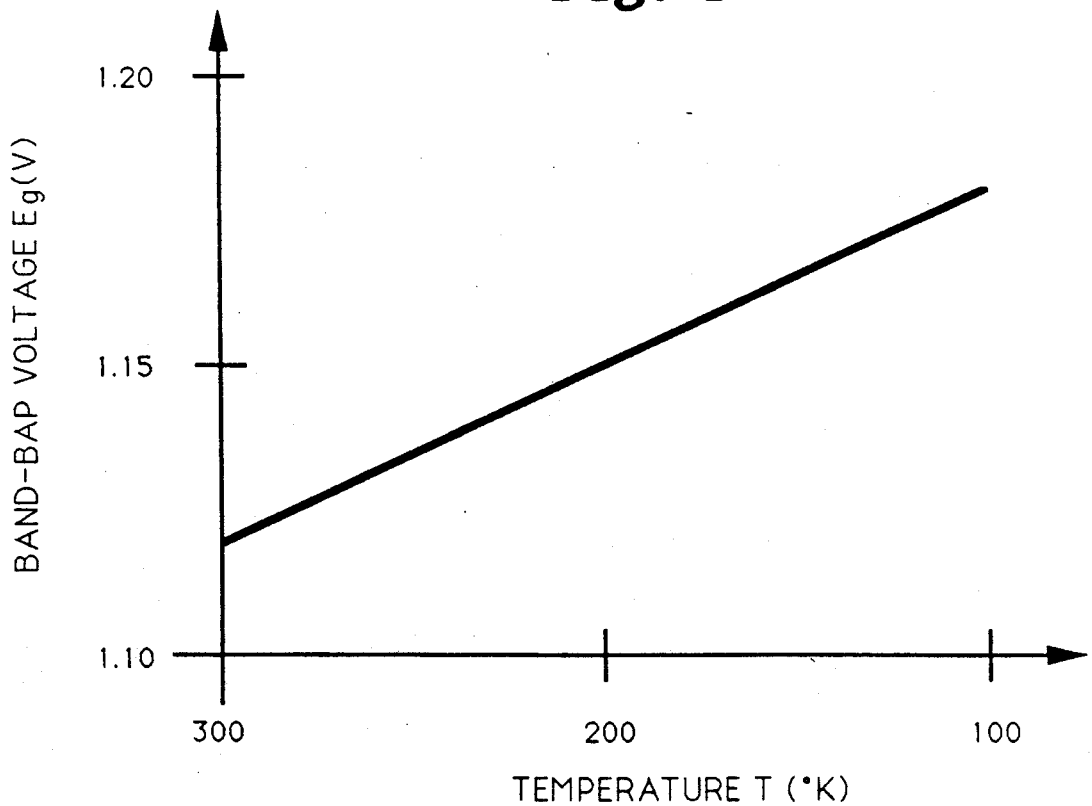
FIG. 2 illustrates temperature dependence of the band-gap voltage.

This temperature dependence of the band-gap voltage is graphically depicted in FIG. 2. For heavily-doped semiconductor materials, an additional gap-narrowing factor is introduced:

$$\Delta E_g = \frac{3q^2}{16\pi\epsilon_s}\left(\frac{q^2 N_e}{\epsilon_s k_2 T}\right)^{\frac{1}{2}}$$

where:
$\epsilon_s$ is the semiconductor permittivity, and
$N_e$ is the emitter doping concentration.
This expression for the additional band-gap narrowing factor is easily simplified to show its temperature relationship:

$$\Delta E_g = \left(\frac{0.1519 N_e}{10^{18} T}\right)^{\frac{1}{2}}$$

Introducing the $\Delta E_g$ term into $E_g$, and substituting, the equation for junction potential becomes:

$$\phi = \frac{k_2 T}{q} \ln\left\{\frac{C_1}{T^3} \times e^{\frac{1}{k_1 T}[1.205 - 0.00028 T - (\frac{0.1519 N_e}{10^{18} T})^{\frac{1}{2}}]}\right\}$$

Figure 3:
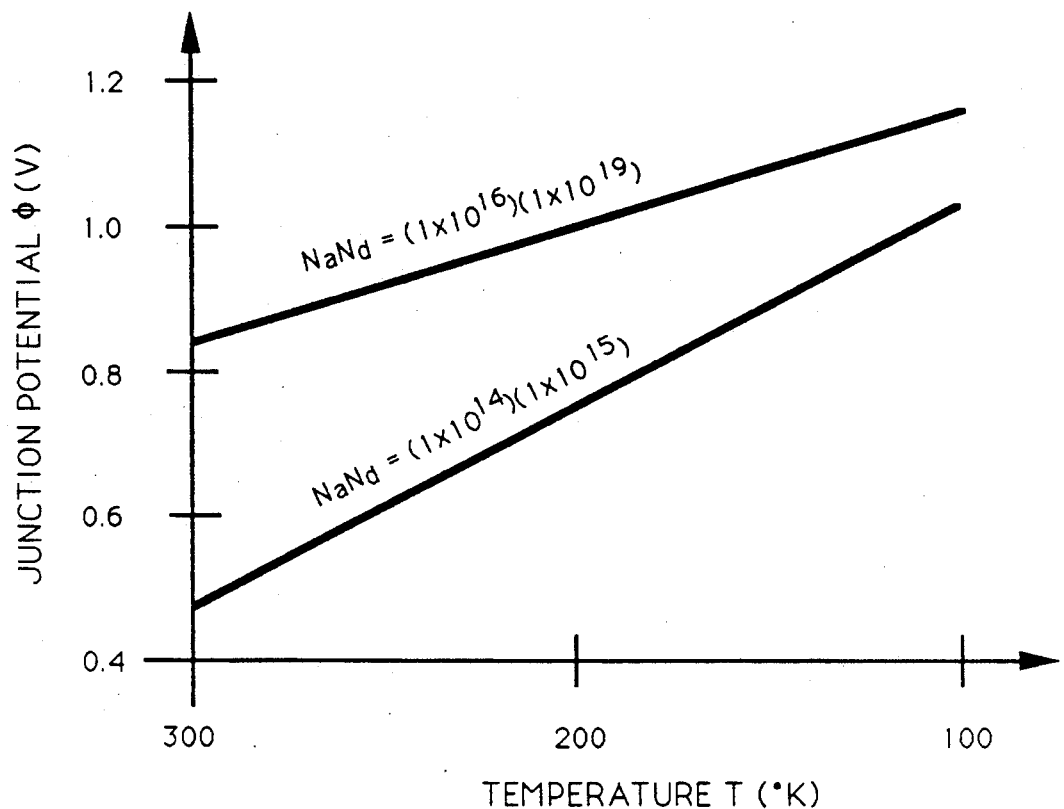
FIG. 3 depicts variation of junction potential with temperature for different donor and acceptor concentrations.

Then, rewriting this expression as:

$$\phi = \frac{k_2 T}{q} \ln\left\{\frac{C_1}{T^3} e^{\frac{1}{k_1}[-0.00028 + \frac{1.205}{T} - (\frac{0.1519 N_e}{10^{18} T^3})^{\frac{1}{2}}]}\right\}$$

and, finally:

$$\phi = 1.205 - 0.00028 T - \left(\frac{0.1519 N_e}{10^{18} T}\right)^{\frac{1}{2}} + k_1 T \ln\left(\frac{C_1}{T^3}\right)$$

clearly demonstrates the temperature dependence of the junction potential, $\phi$. FIG. 3 illustrates the junction potential's temperature dependence for different values of donor and acceptor carrier concentrations. It will be observed that the junction potential is higher for more heavily doped semiconductor materials (upper curve).

Returning to the originally-derived expression for junction potential in terms of donor and acceptor carrier concentrations, the junction potential at a predetermined reference temperature can be equated to junction potential at an arbitrary temperature with the addition of an optimizing carrier density term:

$$\frac{k_2 T_o}{q} \ln\left(\frac{N_a N_d}{n_{io}^2}\right) = \frac{k_2 T}{q} \ln\left(\frac{N_a N_d}{(n_i + n_o)^2}\right)$$

where:
$T_o$ is the reference temperature (°K.),
$n_{io}$ is the intrinsic carrier concentration at $T_o$, and
$n_o$ is the optimizing carrier density.

The final expression for junction potential can thus be solved for $n_o$, the optimizing carrier density:

$$n_o = \left(\frac{N_a N_d}{e^{C_2}}\right)^{\frac{1}{2}} - n_i$$

where:

$$C_2 = \frac{T_o}{T} \ln\left(\frac{N_a N_d}{n_{io}^2}\right)$$

Figure 4:
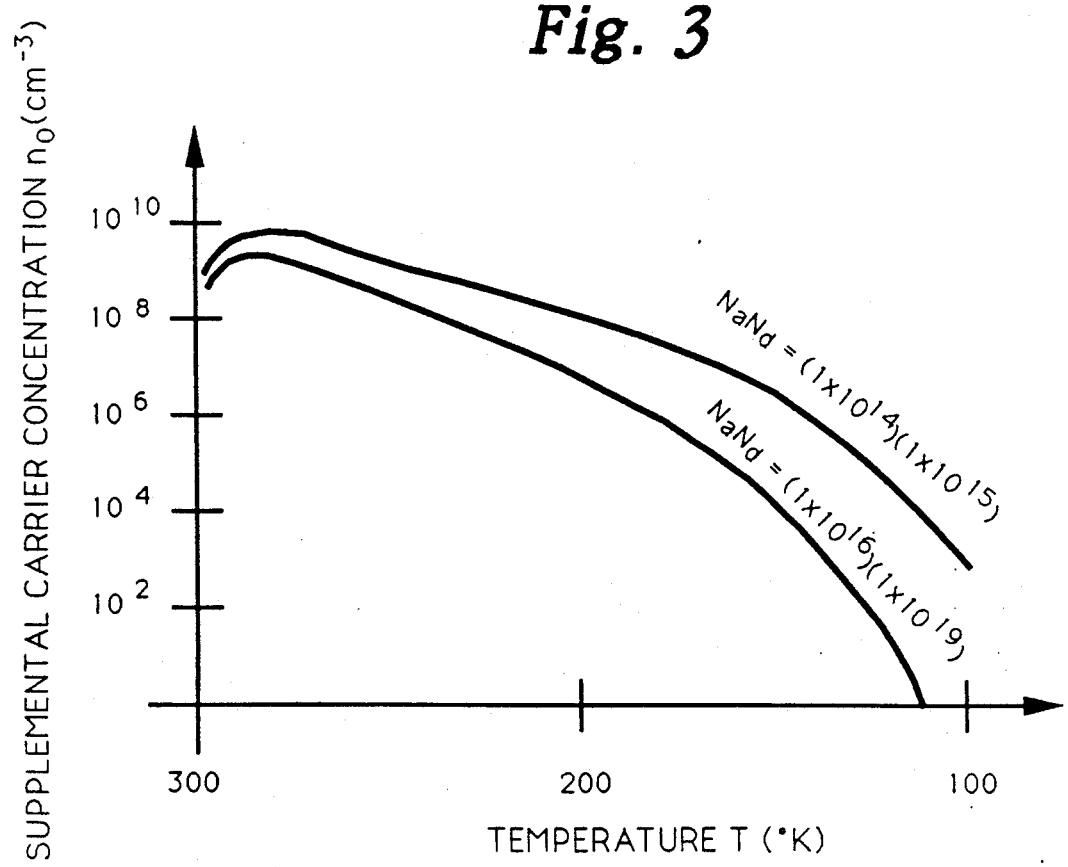
FIG. 4 shows supplemental carrier concentration necessary to offset temperature-induced changes in intrinsic carrier concentration.

Therefore, a supplemental carrier concentration, $n_o$, is necessary to maintain the junction potential, $\phi$, at a substantially constant level. The necessary levels of supplemental carriers are plotted versus temperature in FIG. 4, for different donor and acceptor concentrations.

It is known in the art that incident optical energy affects bulk carrier concentration as follows:

$$n = \left(\frac{P_{opt}}{h\nu}\right)\tau$$

where:
n is the bulk carrier concentration per unit volume due to incident optical energy,
$P_{opt}$ is optimizing optical power,
$\nu$ is optical frequency, and
$\tau$ is minority carrier lifetime.

Thus, $n_o$, in carrier concentration per cubic centimeter, can be expressed as:

$$n_o = 1 \times 10^{-6} n = 1 \times 10^{-6} \left(\frac{P_{opt}}{h\nu}\right)\tau$$

Substituting into the expression for optimizing carrier density yields:

$$\frac{1 \times 10^{-6} P_{opt} \tau}{\text{Volume} \times h\nu} = \left(\frac{N_a N_d}{e^{C_2}}\right)^{\frac{1}{2}} - n_i$$

Figure 5:
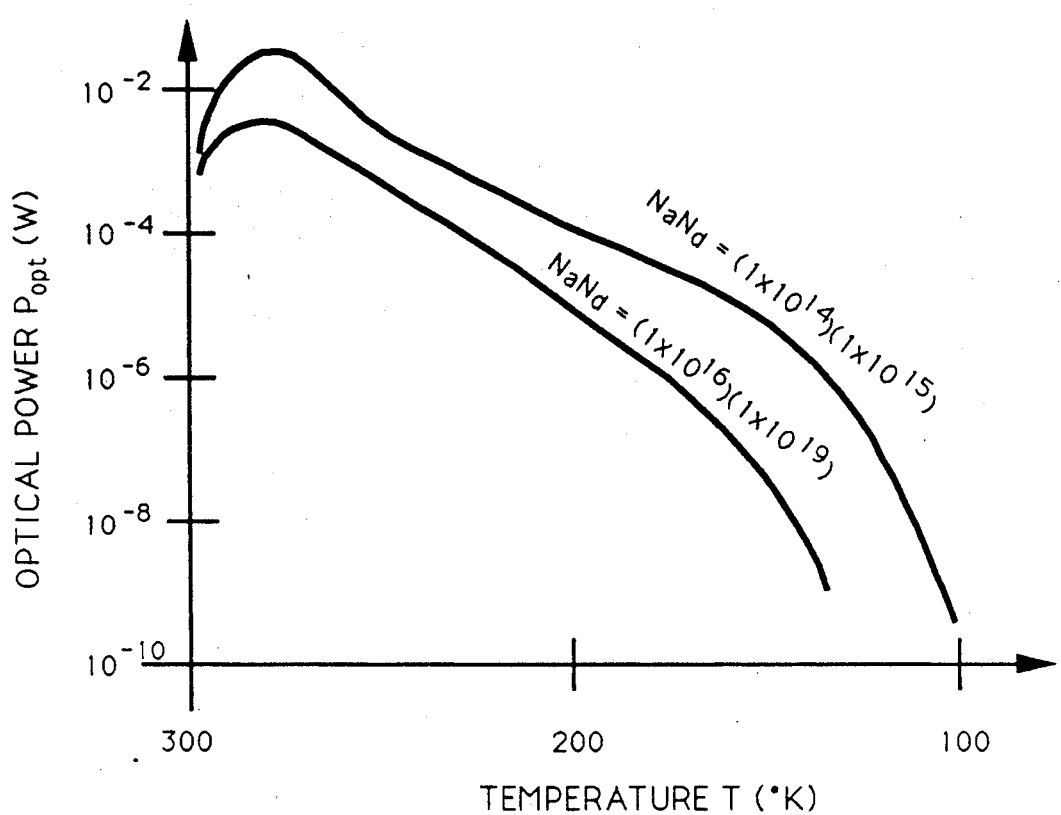
FIG. 5 represents optical power required to maintain junction potential at a predetermined value over temperature.

Now, solving for $P_{opt}$:

$$P_{opt} = \left[\frac{1 \times 10^{-6} \times \text{Volume} \times h\nu}{\tau}\right]\left[\left(\frac{N_a N_d}{e^{C_2}}\right)^{\frac{1}{2}} - n_i\right]$$

where $P_{opt}$ is the optical power, incident on the semiconductor surface, necessary to maintain the junction potential at substantially the same level that exists at a predetermined reference temperature ($T_o$). FIG. 5 is a graph of optical power versus temperature, for two different donor and acceptor concentrations, illustrating that the optical power required to maintain junction potential at a predetermined level actually decreases with decreasing temperature.

Figure 6:
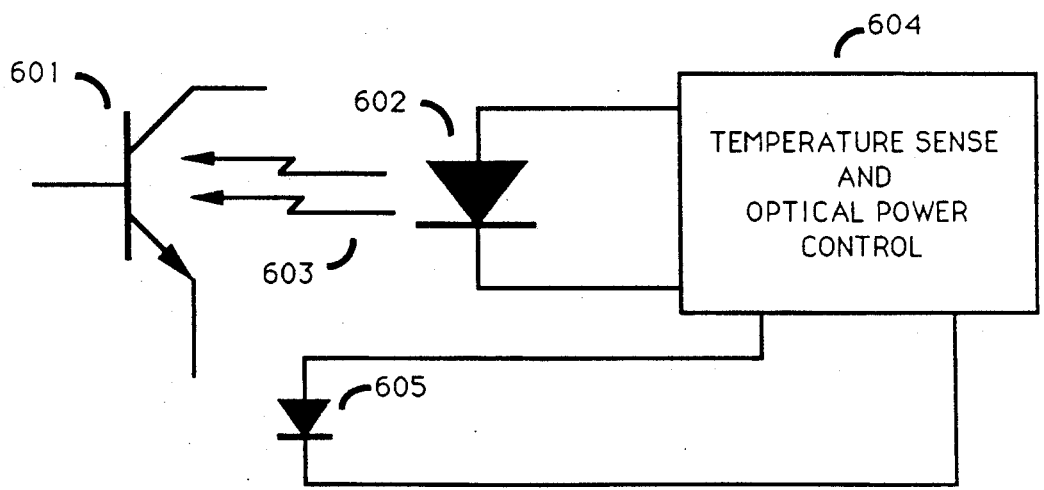
FIG. 6 is a schematic drawing of the optically compensated bipolar transistor of the present invention.

FIG. 6 is a block diagram of an optically compensated bipolar transistor of the present invention. In the illustrated embodiment, a photon source (602) is provided from which photons (603) may be directed toward a bipolar transistor (601) to be compensated. As depicted in the figure, the photon source (602) may be a light emitting diode (LED) or other photon source that emits photons of sufficient energy to create charge carriers in semiconductor material. It is well known that optical output power of an LED may be controlled by varying its current.

Temperature in proximity to the bipolar transistor (601) is measured by a temperature sensor (605), which, in the preferred embodiment, is a reference diode. Since junction potential of the reference diode (605) varies with temperature, sensing the junction potential of the reference diode provides an indication of temperature to a temperature sense and optical power controller (604), which varies photon emission (603) in accordance with temperature to maintain junction potential of the bipolar transistor at a predetermined level. Preferably, the reference diode (605) is optically passivated to render it substantially immune to changes in junction potential introduced by impinging photons. Thus, the reference diode (605) remains a reliable indicator of temperature regardless of the optical output power of the photon source (602).

Of course, the temperature sense and optical power controller (604) may be implemented in a variety of ways well-known in the art. For example, one or more small-signal transistor amplifier stages could be arranged with the reference diode providing an input signal. In response to the reference diode input, current through the LED (602) could be controlled to vary LED output power.

The temperature sense and optical power controller (604) may also be implemented in a microprocessor-based platform with an appropriate input device, such as an analog-to-digital (A/D) converter, to detect reference diode voltage, and an appropriate output device to control photon source optical power.

Figure 9:
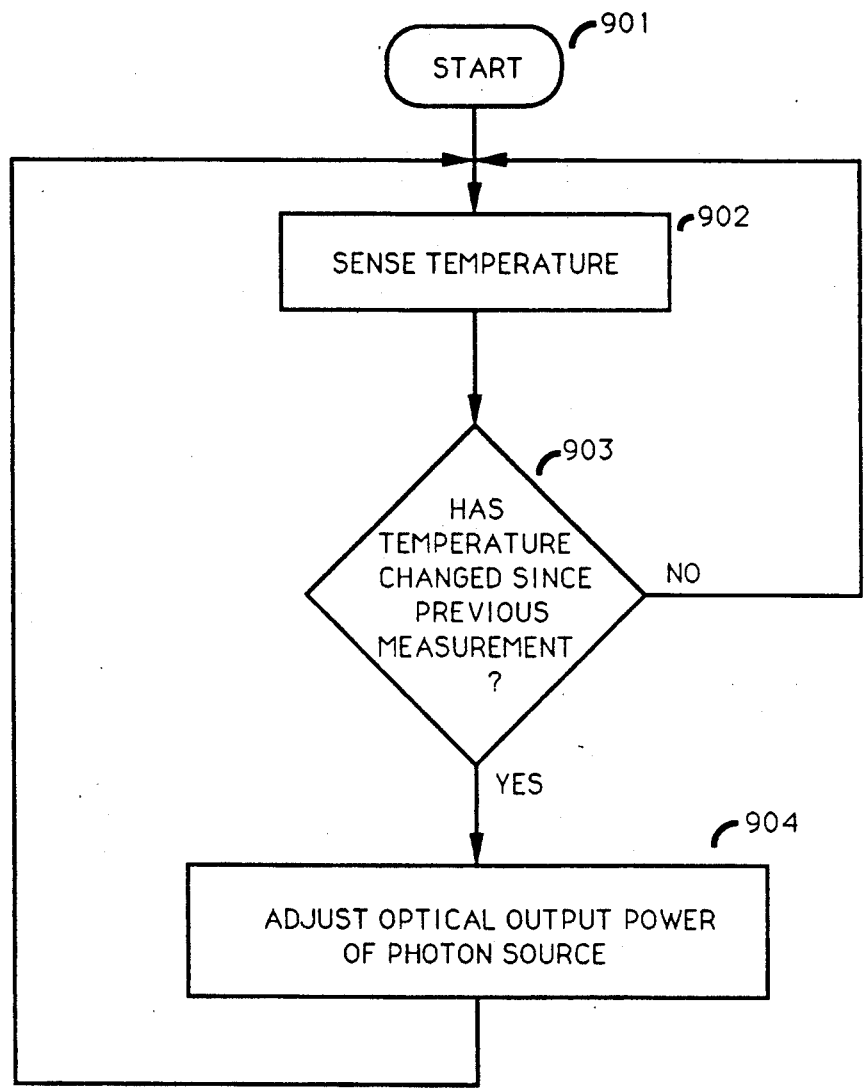
FIG. 9 is a flow chart of an algorithm for varying photon source optical power in response to temperature change.

An appropriate algorithm adaptable for execution in microprocessor software is illustrated in FIG. 9. After program start (block 901), temperature is sensed in block 902. The temperature value is tested in block 903 to determine if it has changed since the last measurement. If a change has occurred, optical output power of the photon source is adjusted accordingly in block 904 to maintain junction potential at a predetermined level. If no change is detected, processing resumes with another temperature sense operation at block 902.

Figure 7:
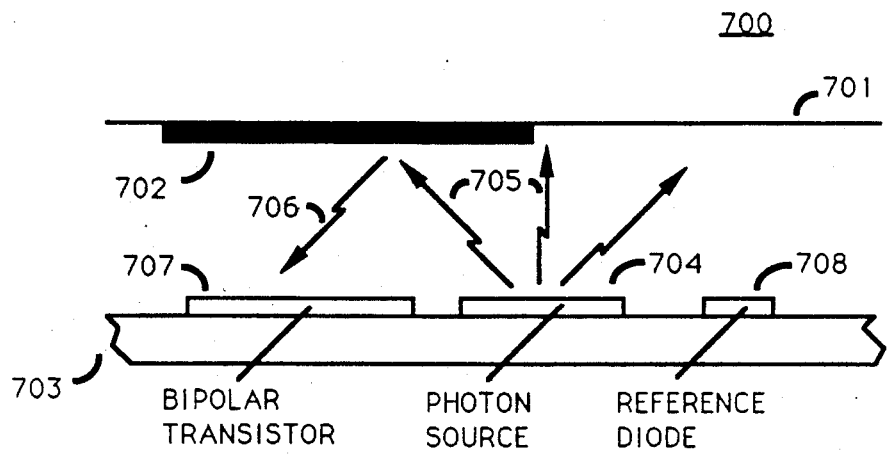
FIG. 7 shows the bipolar transistor, photon source, and temperature sensor within a bipolar transistor package.

One method of directing photons toward a bipolar transistor to be compensated is shown in FIG. 7. As generally depicted by the number 700, a bipolar transistor package (701) is constructed to contain a substrate (703) having a bipolar transistor (707), a photon source (704), and a reference diode (708). The package (701) has at least a partially reflective area (702) disposed upon an interior surface. The reflective area may be established, among other ways, by a metallization process.

In response to changes in temperature sensed by the reference diode (708), optical output power of the photon source (704) is adjusted so that the photon source (704) emits varying numbers of photons (705). At least some of these photons (705) are reflected by the reflective area (702). These reflected photons (706) are directed onto the bipolar transistor (707) to substantially maintain junction potential at a predetermined level.

Figure 8:
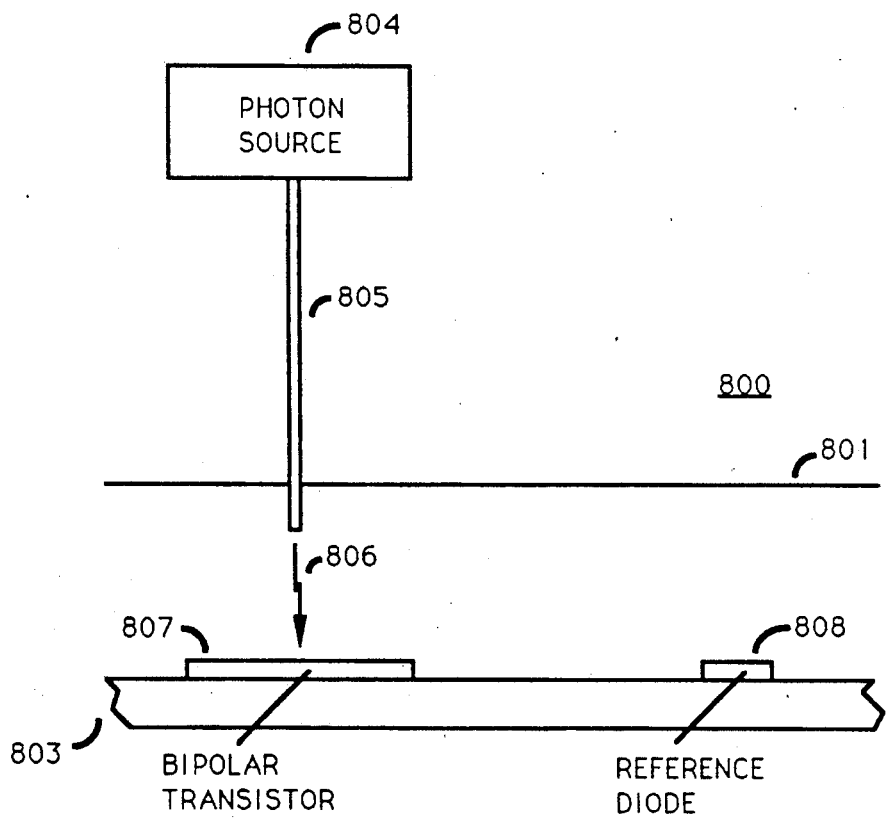
FIG. 8 illustrates the use of a photon source located remotely from the bipolar transistor.

In an alternate embodiment, as illustrated in FIG. 8, a photon source (804) is located remotely from the bipolar transistor package (800). The bipolar transistor (807) and reference diode (808), constructed on an appropriate substrate (803), are substantially housed within the package (800). An appropriate optical medium, such as a fiber optic cable (805), leads from the photon source (804) through the package boundary (801), so that photons (806) from the photon source (804) may be directed toward the bipolar transistor (807).

What is claimed is:

1. A method for compensating junction potential of a bipolar transistor for changes caused by variation in intrinsic carrier density due to temperature change, the method comprising the steps of:
   (a) sensing temperature of the bipolar transistor; and, in response thereto
   (b) directing a sufficient number of photons toward the bipolar transistor to substantially maintain the junction potential at a predetermined level.

2. The method in accordance with claim 1, wherein the step (a) of measuring temperature comprises measuring junction potential of a reference diode.

3. The method in accordance with claim 2, wherein the reference diode is placed in relatively close proximity to the bipolar transistor.

4. The method in accordance with claim 1, wherein the step (b) of directing a sufficient number of photons toward the bipolar transistor comprises varying optical output power of a photon source in response to the temperature sensed in step (a).

5. The method in accordance with claim 4, wherein the photon source comprises a light emitting diode.

6. A method for compensating junction potential of a bipolar transistor for changes caused by variation in intrinsic carrier density due to temperature change, the method comprising the steps of:
   (a) providing a photon source having a variable output power, at least in part directed toward the bipolar transistor to be compensated;
   (b) providing a temperature sensor having an output substantially related to temperature of the bipolar transistor to be compensated; and
   (c) adjusting the output power of the photon source in response to the temperature sensor output to substantially maintain the junction potential of the bipolar transistor at a predetermined level.

7. The method in accordance with claim 6, wherein the photon source comprises a light emitting diode.

8. The method in accordance with claim 6, wherein the temperature sensor comprises a reference diode.

9. The method in accordance with claim 8, wherein the reference diode is optically passivated.

10. An apparatus for compensating junction potential of a bipolar transistor for changes caused by variation in intrinsic carrier density due to temperature change, the apparatus comprising:
    a photon source having a variable output power, at least in part directed toward the bipolar transistor to be compensated;
    a temperature sensor having an output substantially related to temperature of the bipolar transistor to be compensated; and
    means for adjusting the output power of the photon source in response to the temperature sensor output to substantially maintain the junction potential of the bipolar transistor at a predetermined level.

11. The apparatus of claim 10, wherein the photon source comprises a light emitting diode.

12. The apparatus of claim 10, wherein the temperature sensor comprises a reference diode.

13. The apparatus of claim 12, wherein the reference diode is optically passivated.

14. For a bipolar transistor substantially housed in a package having at least a partially reflective area disposed upon an interior surface thereof, a method for compensating junction potential for changes caused by variation in intrinsic carrier density due to temperature change, the method comprising:
    (a) sensing temperature of the bipolar transistor; and, in response thereto
    (b) directing photons toward said at least partially reflective area so that at least a portion of the photons are reflected onto the bipolar transistor to substantially maintain the junction potential at a predetermined level.

15. For a bipolar transistor substantially housed in a package, a method for compensating junction potential for changes caused by variation in intrinsic carrier density due to temperature change, the method comprising:
    (a) sensing temperature of the bipolar transistor; and, in response thereto
    (b) directing photons toward said bipolar transistor from a photon source located remotely from said package to substantially maintain the junction potential at a predetermined level.

16. The method in accordance with claim 15, wherein photons from the remotely located photon source are directed toward the bipolar transistor via a fiber optic cable.

* * * * *